Figure 1A:
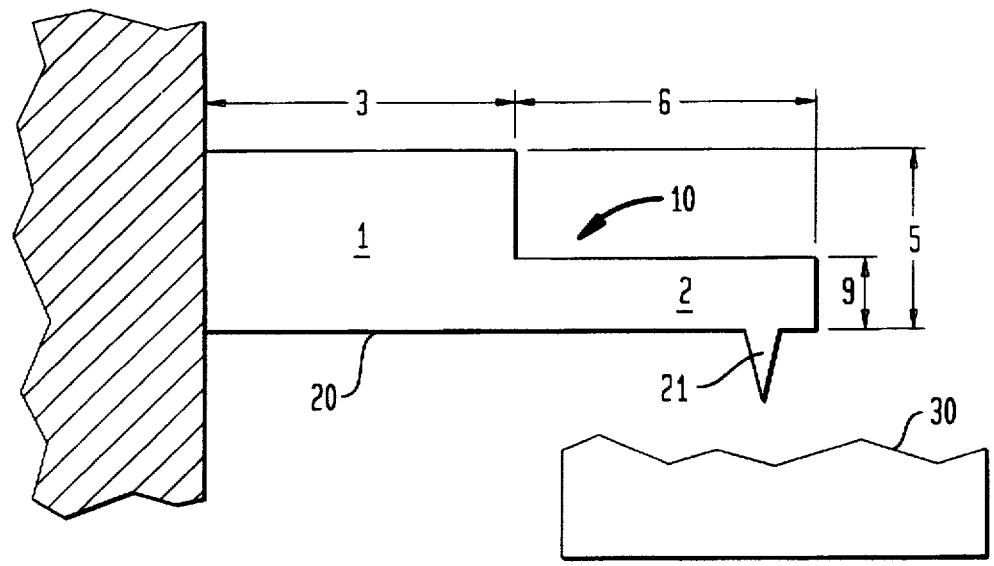

United States Patent [19]
Bayer et al.

[11] Patent Number: 5,789,666
[45] Date of Patent: Aug. 4, 1998

[54] RESONANT SENSOR FOR DETERMINING MULTIPLE PHYSICAL VALUES

[75] Inventors: Thomas Bayer, Aidlingen-Dachtel; Johann Greschner, Pliezhausen; Gerhard Schmid, Leinfelden-Echterdingen; Volker Wolf, Sindelfingen, all of Germany

[73] Assignee: International Business Machines Corporation, Armonk, N.Y.

[21] Appl. No.: 737,635

[22] PCT Filed: Sep. 29, 1994

[86] PCT No.: PCT/EP94/03257

§ 371 Date: Nov. 15, 1996

§ 102(e) Date: Nov. 15, 1996

[87] PCT Pub. No.: WO95/31693

PCT Pub. Date: Nov. 23, 1995

[30] Foreign Application Priority Data

May 17, 1994 [DE] Germany ............................ 44 17 132.3

[51] Int. Cl.$^6$ ............................................. G01N 29/02
[52] U.S. Cl. ................................................. 73/105; 73/579
[58] Field of Search ...................... 73/105, 579; 250/306, 250/307

[56] References Cited

U.S. PATENT DOCUMENTS

| | | | |
|---|---|---|---|
| 5,267,471 | 12/1993 | Abraham et al. | 73/105 |
| 5,406,832 | 4/1995 | Gamble et al. | 73/105 |
| 5,469,733 | 11/1995 | Yasue et al. | 73/105 |
| 5,507,179 | 4/1996 | Gamble et al. | 73/105 |
| 5,517,280 | 5/1996 | Quate | 250/234 |
| 5,540,958 | 7/1996 | Bothra et al. | 427/535 |

FOREIGN PATENT DOCUMENTS

| | | |
|---|---|---|
| 0472342 | 2/1992 | European Pat. Off. . |
| 0611945 | 8/1994 | European Pat. Off. . |
| 1276238 | 8/1968 | Germany . |

OTHER PUBLICATIONS

"Scanning Force Microscopy with Micromachined Silicon Sensors" by M. Nonnemacher, J. Greshner and O. Wolter, R. Kassing, Journal of Vacuum Science and Technology: Part B, Mar. 1991, New York pp. 1358–1362.

"Resonant Silicon Sensors" by Göran Stemme, Journal of Micromechanical Engineering, 1991, pp. 113–125.

"Kelvin Prope Force Microscopy" by M. Nonnemacher, M.P. O'Boyle, and H.K. Wickramasinghe, Applied Physics Letter, Jun. 1991, pp. 2921–2923.

"Simultaneous Measurement of Lateral and Normal Forces with an Optical–Beam–Deflection Atomic Force Microscope" by Gerhard Meyer and Nabil M. Amer, Applied Physical Letters, Nov. 1990 pp. 2089–2091.

"Speech Coder Utilizing Semiconductor Cantilevers" by R.J. Wilfinger and R.A. Carballo, IBM Technical Disclosure, Jan. 1968 p. 1259 (Abstract).

Primary Examiner—Hezron E. Williams
Assistant Examiner—Rose M. Miller
Attorney, Agent, or Firm—Stephen S. Strunck

[57] ABSTRACT

The invention relates to a resonant sensor with a vibrating body (10) for the determination of at least two physical values characterised by the fact that the vibrating body (10) has at least two partial bodies (1, 2), the vibrating body as a whole (10) being appropriate for the determination of one of the two values and one of the partial bodies (1, 2) or a combination of several partial bodies is appropriate for the determination of the other of the two values. The individual partial bodies (1, 2) of the vibrating body can differ both in their geometric, dimensions and or in the materials of which they are composed. The measurement of the individual physical values takes place in a fundamental mode of the vibrating body as a whole (10) or of the relevant partial body (1, 2). If a resonant sensor of this type with a vibrating body in the form of a double transverse beam (10) and a fine tip (21) is used as a sensing probe in Scanning Kelvin Probe Force Microscopy, the surface potential of the surface (30) of the object under examination can be measured with a high degree of lateral resolution.

20 Claims, 2 Drawing Sheets

RESONANT SENSOR FOR DETERMINING MULTIPLE PHYSICAL VALUES

TECHNICAL FIELD

The invention relates to a resonant sensor with a vibrating body for the determination of at least two physical values. It is especially suitable for use in Scanning Kelvin Probe Force Microscopy.

STATE OF THE ART

A resonant sensor consists essentially of a vibrating body, a component which excites this vibrating body into resonant vibration and a component which measures the vibratory behavior of the vibrating body.

The vibrating body must be appropriate to the measuring task as regards its mechanical properties, in particular its elasticity constant, resonance frequency and quality factor.

Vibrating bodies usually exhibit infinitely many degrees of freedom and hence infinitely many natural vibrations or resonance modes with infinitely many associated resonance frequencies. The lowest resonance frequency is designated the first resonance frequency while its associated resonance mode is designated the fundamental vibration frequency or fundamental mode.

Various possible ways of exciting the vibrating body into vibration are described in "Micromechanics" by Anton Heuberger, Springer Publishing House, Berlin 1989, pages 355–418. In particular this excitation can be effected by the periodic application of thermal energy, by electromagnetic or electrostatic forces or by piezoelectric actuators.

Various applications of resonant sensors are described in "Resonant sensors and Applications" by P. Hauptmann, Sensors and Actuators A. 25 to 27 (1991), pages 371–377. Especially prominent among the advantages of resonant sensors are their high resolution, the availability of low-cost manufacturing processes and the generation of a frequency-analogue or quasi-digital output signal.

Air-damping effects in the use of quartz resonators as tactile and non-tactile sensors are described by M. Weinmann et al. in "Measuring profile and position by means of vibrating quartz resonators used as tactile and non-tactile sensors", Sensors and Actuators A37–38 (1993), pages 715–722. The associated air-flow and viscosity relationships must be taken into account when using resonant sensors.

The use of resonant force sensors in scanning force microscopy (SFM) is described by M. Nonnemacher at al. in "Scanning Force Microscopy with Micromachine Silicon Sensors", Journal of Vacuum Science and Technology B9(2), 1991, pages 1358–1362. Here long-range force interactions between the vibrating body and the surface of the object under examination are measured and the surface topography of the object thus established. For this application vibrating bodies with an elasticity constant of approximately 10 to 100 N/m and a resonance frequency of approximately 200 to 1000 kHz haste proved particularly suitable. In order to increase the lateral resolution of the force sensor the vibrating body used as the sensing probe is configured as a transverse beam with a fine tip.

In European Patent Application EP-A2-0 472 342, "Micro-displacement type information detection probe device and microscope and information processing device by use thereof", Date of Application Aug. 13th, 1991 an information-recognising measurement probe of the displacement type is described where a transverse beam of a first stage is displaced by means of piezo-electrical actuators and a transverse beam of a second stage carries the measurement probe. By the configuration of the transverse beams of the first and second stage, greater displacement of the measurement probe is made possible in comparison with the state of the art, thus making it possible to follow topographical features and variations in the μm region of a recording medium or of a substrate.

In M. Nonnemacher et al. "Kelvin Probe Force Microscopy", Applied Physics Letters, 58 (1991) Pages 2921–2923, a resonant sensor is introduced, which is used for the determination of two physical values. By means of electro-static excitation of the vibrating body at its resonance frequency and the use of a closed measurement loop, the contact potential difference or the exit work-function difference between the vibrating body and the surface of the object under examination is determined. By using an additional piezo-electrical excitation of the vibrating body with a frequency which lies above the resonance frequency of the vibrating body and by using a second closed measurement loop, the long-range atomic force interaction and, as a consequence, the average distance between the vibrating body and the surface of the object under examination is determined or controlled at a constant level. At the same time, the vibration behavior of the vibrating body is analyzed optically by a heterodyne interferometer. This interferometer is a constituent part of both of the two closed measurement loops.

The last-cited publication represents the nearest aspect of the state of the art by comparison with the discovery.

DISADVANTAGES OF THE STATE OF THE ART

In the case of the known resonant probes for the determination of two physical values it is necessary on the one hand to excite the vibrating body with its resonance frequency and on the other to excite it with a frequency which lies outside its resonance frequency.

The excitation of a vibrating body with a frequency outside its resonance frequencies, however, delivers only relatively small vibration amplitudes. This results in a lowered level of sensitivity for the physical value to be measured in this vibration mode. A further disadvantage is the necessary level of technical resources required to be able to examine the vibration behavior of a vibrating body in a vibration mode outside the resonance mode of the vibrating body. Since one of the two physical values in the resonance mode of the vibrating body can be measured with high sensitivity, there is the further disadvantage that it is only possible to measure the two physical values at different levels of sensitivity.

OBJECTIVE

The basic task of the discovery is, therefore, to create a resonant probe which permits the measurement of each of at least two physical values with great sensitivity. At the same time, the level of technical resources required for the measurement of the vibration behavior of the vibrating body is to be as small as possible.

REALISATION OF THE OBJECTIVE

In accordance with the invention the objective is realised in a resonant sensor of the type described above by means of a vibrating body which consists of at least two partial bodies where the vibrating body as a whole is suitable for the measurement of one of the two values and one of the partial bodies or a combination of several of the partial bodies is suitable for the measurement of the other of the two values.

Its advantage lies in the fact that the vibrating body as a whole or the individual partial bodies or a combination of several of the partial bodies can be designed independently of each other to optimise the measurement of the pertinent physical value so that each of the at least two physical values is measurable with a high degree of sensitivity. A further advantage lies in the fact that the division of the vibrating body into several partial bodies permits the vibratory behavior of the individual partial bodies to be measured with relatively meagre technical resources.

In one form of the invention the individual partial bodies constituting the vibrating body are of differing geometric dimensions. This form has the advantage that from the technical viewpoint differing geometric dimensions are simple to manufacture. It has the further advantage that various manufacturing processes exist for the geometric design of the partial bodies. In particular such vibrating bodies can be manufactured monolithically. It has the further advantage that the geometric design of the partial bodies permits many degrees of freedom as regards the optimisation of the individual partial bodies for the measurement of the pertinent physical value.

In another form of the invention the individual partial bodies constituting the vibrating body are made of different materials. It is advantageous that this form is possible as an alternative or in addition to the differential shaping of the vibrating body. The differences in the material composition can refer both to the use of different materials and to the local modification of a single material. The use of different materials can be advantageous if it enables favourable properties to be achieved, for example surface passivation or general corrosion protection. The local modification of a material can, for example, be advantageous with very small vibrating bodies where the modification of the material can be carried out, for example, by ion implantation of foreign substances.

In another form of the invention the measurement of the individual physical values is carried out in a fundamental mode of the vibrating body as a whole or of the pertinent partial body or of the pertinent combination of partial bodies. This form has the advantage that in resonant sensors the fundamental mode as a rule produces the greatest sensitivity as regards the physical value to be measured. It is a further advantage that the fundamental mode of a vibrating body as a rule lies within a frequency range which from a technical viewpoint is very easy to control. It is a further advantage that the vibratory behaviour of the vibrating body in its fundamental mode can be analysed with relatively meagre technical resources.

In another form of the invention the vibrating body is miniaturised so that it can be manufactured in one piece by the methods of precision mechanics, micromechanics or nanomechanics. As a rule sensors manufactured by these processes, owing to the precision of the manufacturing processes, have a high degree of sensitivity for this physical values which are to be measured and can be perfectly accommodated to the task in hand. A further advantage stems from the fact that sensors manufactured in this manner are as a rule small and light, as well as being relatively inexpensive to manufacture owing to the availability of batch processes.

In another form of the invention the vibrating body is a transverse beam. This form has the advantage that a transverse beam has properties which are favourable for many applications. It is relatively easy to excite into vibration, for example by means of thermal, electrostatic, electromagnetic or piezoelectric excitation. It is a further advantage that a transverse beam which has been induced to vibrate exhibits a relatively large amplitude of vibration. Linked with this is the advantage of a relatively high degree of sensitivity with respect to the value which is to be measured. It is a further advantage that a transverse beam is relatively easy to manufacture by a variety of manufacturing methods. It is a further advantage that owing to its geometric dimensions a transverse beam exhibits favourable flow conditions in the vibration mode.

In another form of the invention the elasticity constants of the transverse beam and at least one of its partial bodies in the relevant resonance mode lie in the range between 1 N/m and 100 N/m. This form has the advantage that the transverse beam and the partial body or bodies of the transverse beam with such elasticity constants exhibit a high degree of sensitivity towards the physical value which is to be measured. Furthermore have an adequate elasticity constant with regard to the reduction of parasitic disturbance variables and with regard to the overload protection of the mechanical structure. It is a further advantage that transverse beams of this sort permit a high rate of measurement.

In another form of the invention the resonance frequencies of the transverse beam and at least one of its partial bodies in the relevant resonance mode are greater than 20 kHz. Transverse beams of this sort have the advantage that they are relatively insensitive to disturbances due to impact and audible sound. It is also an advantage that this resonance-frequency range can easily be covered with appropriately miniaturised resonant sensors. It is a further advantage that a high rate of measurement can be achieved in this resonance-frequency range.

In another form of the invention the transverse beam consists of two partial bodies which differ in the geometric dimensions of length, breadth and height. It is advantageous that the variation in the three geometric dimensions of the transverse beam provides three degrees of freedom with which sensitivity and other sensor characteristics can be maximised.

In another form of the invention the ratio between the lengths of the two partial bodies has a value between approximately 3:1 and approximately 4:1, particularly in the region of 3.57:1; the ratio between the breadths of the two partial bodies has a value between approximately 3:1 and approximately 4:1, in particular approximately 3.33:1; and the ratio between the heights of the two partial bodies has a value between approximately 2:1 and approximately 4:1, in particular approximately 3:1. This form has the advantage that a vibrating body with such dimensions makes vibration possible both in the fundamental mode of the vibrating body as a whole and in the fundamental mode of one of the partial bodies, the other partial body in the latter case acting as a rigid mounting for the partial body which is in vibration.

In another form of the invention the first partial body has a length of approximately 250 μm, a breadth of approximately 50 μm and a height of approximately 6 μm while the second partial body has a length of approximately 70 μm, a breadth of approximately 15 μm and a height of approximately 2 μm. This geometric configuration has the advantage that it makes possible the measurement of very weak forces. It is a further advantage that both the resonance frequency and the elasticity constant of the transverse beam as a whole and of the second partial body lie within a range favourable for the measurement of physical values.

In another form of the invention one end of the transverse beam is rigidly mounted. This has the advantage that the transverse beam as a whole or a partial body or a combination of partial bodies can vibrate in the fundamental mode of a rod rigidly mounted at one end. This achieves a high degree of sensitivity of the resonant sensor with respect to the physical value which is to be measured. It is a further advantage that the vibratory behaviour of a vibrating rod rigidly mounted at one end can be analysed with relatively meagre technical resources.

In another form of the invention the transverse beam consists of silicon, preferably of monocrystalline silicon. This is of advantage because the mechanical properties of silicon make it very suitable for use as vibrating-body material; in particular it has a low specific weight and a high modulus of elasticity. In the monocrystalline structure silicon also has the further advantage that the crystalline structure renders all deformations fully elastic, in particular no material creep taking place. This leads to the further advantage of a high-quality vibrating body. It is a further advantage that highly-developed structuring processes are available for silicon. Moreover the use of silicon as the material permits the integration of microelectronic functions into the vibrating body.

In another form of the invention the vibrating body has a sensing probe. The advantage of this lies in the fact that the sensing probe can be adapted to the measuring objective without modifying the vibrating body. It is also advantageous that the use of a sensing probe permits the distance between the vibrating body and the surface of the object under examination to be increased. This allows pneumodynamic damping effects to be reduced.

In another form of the invention the sensing probe has a fine tip. The use of a fine tip as a sensing probe has the advantage that an extremely high degree of lateral resolution can be achieved in the measurement of physical values.

In another form of the invention the sensing probe and in particular its fine tip consist of silicon, in particular of monocrystalline silicon. This is advantageous in that processes exist for the manufacture of fine tips from silicon. Furthermore the good mechanical properties of silicon make its use as the tip material advantageous. Its low specific weight and high modulus of elasticity should be specially mentioned in this connection.

Furthermore the invention relates to the use of the resonant sensor in Scanning Force Microscopy, where one of the physical values which are to be measured is the long-range interaction between the surfaces of two objects which enables a constant average distance to be maintained between the vibrating body and the surface of the object under examination. Here it is advantageous that the use of the resonant sensors permits a very small distance to be maintained between the sensor and the surface of the object under examination. This small distance permits the measurement of various other physical values.

Furthermore the invention relates to the use of the resonant sensor in Scanning Kelvin Probe Force Microscopy in which the surface potential of the object under examination can be determined as a second physical value in addition to long-range interaction with the purpose of distance control. Here it is advantageous that knowledge of the surface potential of the object under examination permits the determination of the type of material of which it consists. Furthermore other characteristics including crystalline defects, surface defects, concentrations of foreign substances, contamination and corrosion phenomena are also measurable by means of the surface potential.

Furthermore the invention relates to the use of the resonant sensor in Scanning Kelvin Probe Force Microscopy in which the vibrating body as a whole is excited into vibration, particularly in its fundamental mode, and a constant average distance between the vibrating body and the surface of the object under examination can be maintained by determining the influence of long-range interaction on the vibratory behaviour of the vibrating body, and where one of the partial bodies is excited into vibration, particularly in its fundamental mode, and the surface potential of the object under examination can be determined by determining the contact potential. Here it is advantageous that with a resonant sensor of this type the topography and the surface potential of the surface of the object under examination can be determined simultaneously. To this purpose the resonant sensors and the surface of the object under examination are moved with respect to each other. This simultaneous measurement of two physical values results in a time advantage. It is a further advantage that owing to the small distance between the vibrating body or its sensing probe and the surface of the object under examination the surface potential can be determined with a high degree of resolution.

In one form of the invention the vibrating body as a whole is piezo-electrically excited into vibration in its fundamental mode while the partial body is excited into vibration in its fundamental mode by the application of alternating current between the transverse beam and the object under examination. Here it is advantageous that piezo-electrical excitation is a relatively simple technical matter. It is a further advantage that piezo-electrical excitation makes possible a broad spectrum of excitation frequencies and excitation amplitudes. Electrostatic excitation has the further advantage that no additional mechanical elements are necessary.

DESCRIPTION OF ILLUSTRATIONS

Figure 1B:
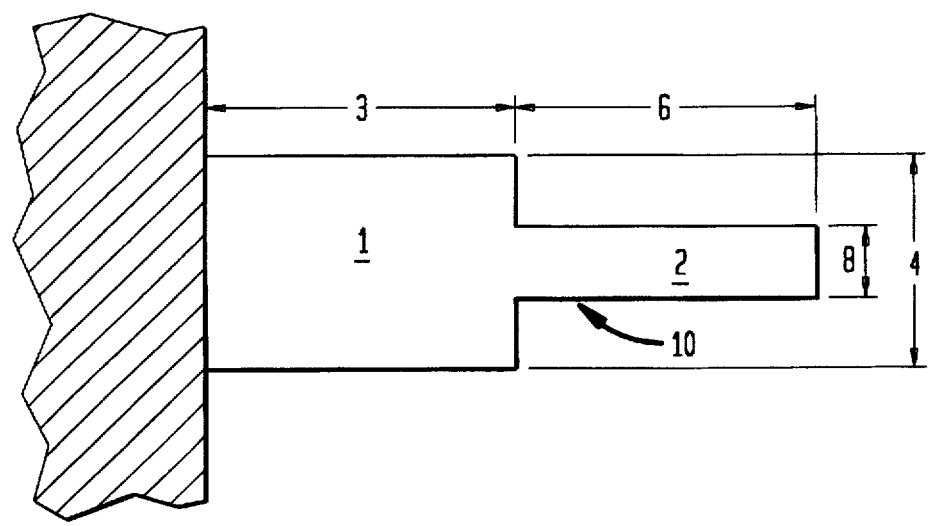
Figure 2:
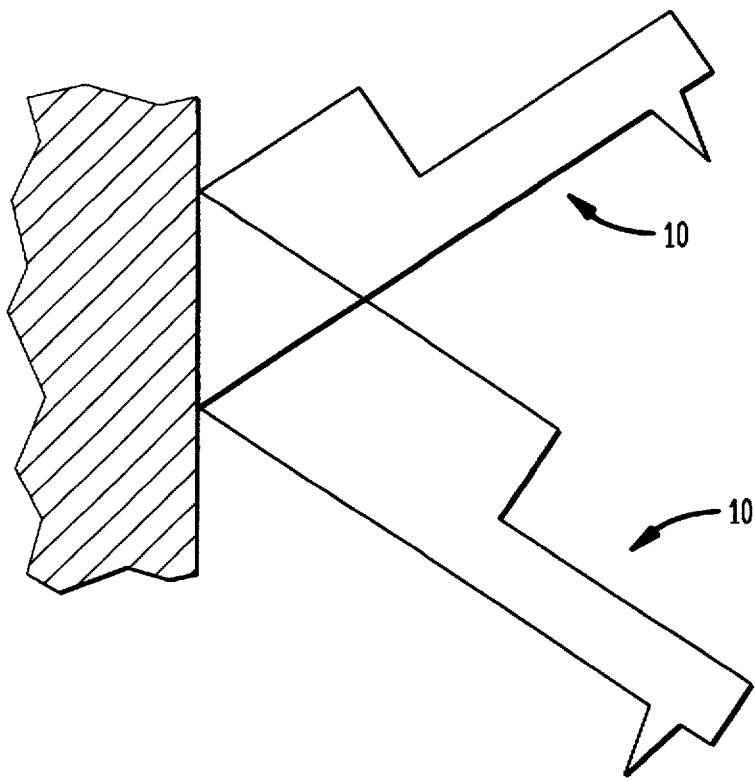
Figure 3:
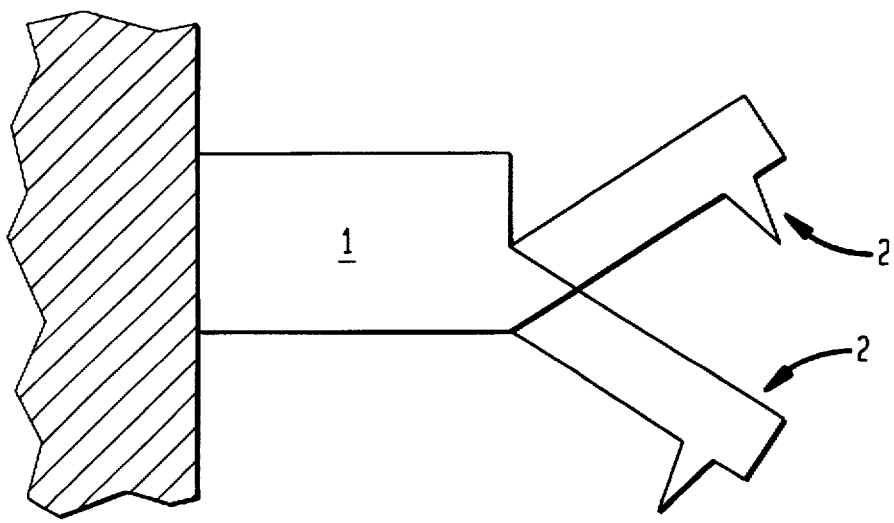

An example of the invention which is shown in the drawings will now be described in more detail. The illustrations show:

FIG. 1a a schematic representation of a side view of a transverse beam which has two partial bodies and a fine tip as the sensing probe FIG. 1b a schematic representation of a plan view of the transverse beam in FIG. 1a FIG. 2 a schematic representation of a deflection of the transverse beam in FIGS. 1a and 1b as a whole in its fundamental mode FIG. 3 a schematic representation of a deflection of the partial body at the free end of the transverse beam in FIGS. 1aand 1b as a whole in its fundamental mode The example of the invention shown in the figures describes a double transverse beam for use in Scanning Kelvin Probe Force Microscopy.

As is shown in FIGS. 1a and 1b, the transverse beam 10 consists of two cuboid partial bodies 1, 2 which are fused together. The first partial body 1 has a length 3 of 250 µm, a breadth 4 of 50 µm and a height 5 of 6 µm while the second partial body has a length 6 of 70 µm, a breadth 8 of 15 µm and a height 9 of 2 µm. As is shown in the side view of the transverse beam 10 in FIG. 1a, the two partial bodies 1, 2 are fused together in such a way that the underside 20 of the transverse beam 10 is level. As is shown in the plan view of the transverse beam 10 in FIG. 1b, the two partial bodies 1, 2 are fused together in such a way that the second partial body 2, viewed from above, is positioned approximately in the middle of the first partial body 1. The transverse beam 10 has a fine tip 21 as a sensing probe. The fine tip 21 is located on the underside 20 of the second partial body 2. The fine tip 21 is conical, tapering away from the transverse beam 10 into a pointed tip. The transverse beam as a whole 10 is rigidly mounted at the end of partial body 1 opposite to the second partial body 2.

The transverse beam as a whole 10 including the fine tip is monolithically manufactured from monocrystalline silicon by microelectronic and micromechanical manufacturing processes.

The transverse beam 10 forms the vibrating body of a resonant sensor which permits the measurement both of the long-range interaction between the transverse beam 10 and the surface 30 of the object under examination and of the surface potential of the surface 30 of the object under examination. In order to achieve a local resolution of the surface potential, the transverse beam 10 and the surface 30 of the of the object under examination are moved with respect to each other.

FIG. 2 shows the deflection of the transverse beam 10 in FIGS. 1a and 1b as a whole in its fundamental mode. The transverse beam 10 as a whole vibrates as a rod rigidly mounted at one end in its fundamental mode. When monocrystalline silicon is used as the material of the transverse beam the elasticity constant is 9.8 N/m and the frequency for the illustrated resonance mode 123 kHz. In the given case this vibration mode is used to determine the long-range interaction between the vibrating body and the surface 30 of the object under examination. The use of an enclosed measuring loop permits the distance between the vibrating body 10 and the surface 30 to be kept constant. The excitation for the vibration mode illustrated is carried out by piezoelectric actuators. The vibratory behaviour is evaluated by means of an interferometer.

FIG. 3 shows the deflection of the second partial body 2 of the transverse beam 10 in FIGS. 1a and 1b in its fundamental mode. In this vibration mode the first partial body acts as a rigid mounting for the second partial body 2, in particular it is not excited into significant vibration. The second partial body 2 vibrates as a rod rigidly mounted at one end in its fundamental mode. When monocrystalline silicon is used as the material of the transverse beam the resonance frequency is 529 kHz. In the given case this vibration mode is used to measure the surface potential of the surface 30 of the object under examination. The vibration mode illustrated is achieved by the application of an appropriate alternating electric voltage between the transverse beam 10 and the surface 310 of the object under examination. The vibratory behaviour is evaluated by means of an interferometer.

We claim:

1. A resonant sensor for the determination of at least two physical values, wherein the resonant sensor comprises:
    a vibrating body made up of at least a first and a second partial body,
    characterized in that the vibrating body is configured for excitation into vibration at the fundamental resonant frequency of the whole vibrating body to measure a first physical value and the first partial body is configured for independent excitation into vibration at the fundamental resonant frequency of the first partial body to measure a second physical value.

2. A resonant sensor in accordance with claim 1, characterized in that
    the first and second partial bodies of the vibrating body have different geometrical dimensions.

3. A resonant sensor in accordance with claim 1, characterized in that
    the first and second partial bodies of the vibrating body are composed of different materials.

4. A resonant sensor in accordance with claim 1, characterized in that
    the vibrating body is rigidly mounted at one end of the second partial body for vibration at the fundamental frequency of the whole vibrating body and
    the second partial body is configured to function as a substantially rigid mount for the first partial body for independent vibration of the first partial at the fundamental resonant frequency of the first partial body.

5. A resonant sensor in accordance with claim 1, characterized in that
    the vibrating body is miniaturized and manufactured one piece by precision-, micro- and/or nano-mechanical procedures.

6. A resonant sensor in accordance with claim 4, characterized in that
    the vibrating body is a transverse beam.

7. A resonant sensor in accordance with claim 6, characterized in that
    the elasticity constants of the transverse beam and of at least one of its partial body in the relevant resonance mode lie in the range between 1N/m and 100N/m.

8. A resonant sensor in accordance with claim 6, characterized in that
    the resonant frequencies of the transverse beam and of at least one of first and second partial bodies in the relevant resonance mode lie above 20 kHz.

9. A resonant sensor in accordance with claim 6, characterized in that the first and second partial bodies differ in the geometrical dimensions of length, breadth, and height to provide three degrees of freedom with which sensitivity can be maximized.

10. A resonant sensor in accordance with claim 9, characterized in that
    the ratio of the lengths of the of the second partial body to the first partial body has a value lying between approximately 3.1 and approximately 4.1, in particular approximately 3.57:1,
    the ratio of the breadths of the second partial body to the first partial body has a value lying between approximately 3.1 and approximately 4.1, in particular approximately 3.33:1, and
    the ratio of the heights of the second partial body to the first partial body has a value lying between approximately 2.1 and 4.1, in particular approximately 3:1.

11. A resonant sensor in accordance with claim 10 characterized in that
    the first partial body has a length of approximately 250 µm, a breadth of approximately 50 µm and a height of approximately 6 µm and
    the second partial body has a length of approximately 70 µm, a breadth of approximately 15 µm and a height of approximately 2 µm.

12. A resonant sensor in accordance with claim 11, characterized in that
    the transverse beam consists of silicon, preferably of mono-crystalline silicon.

13. A resonant sensor in accordance with claim 12, characterized in that
    the vibration body possesses a sensing probe.

14. A resonant sensor in accordance with claim 13, characterized in that
    the sensing probe consists of mono-crystalline silicon.

15. The method of measuring two physical values with a resonant sensor using scanning force microscopy comprising:
- providing a vibrating body made up of at least first and second partial bodies with the fundamental resonant frequency of the vibrating body as a whole selected to detect a first of the two physical values and the fundamental resonant frequency of the first of the partial bodies selected to detect the second of the two physical values;
- vibrating the vibrating body as a whole at the fundamental resonant frequency of the whole vibrating body to measure the first physical value; and
- independently vibrating said first of the two partial bodies at the resonant frequency of that partial body to measure the second of the two physical values.

16. The method of measuring of claim 15 wherein the first physical value is a long range interaction between a second body and the vibrating body which long range interaction is measured by maintaining a constant average distance between the vibrating body and a surface of the second body.

17. The method of measuring of claim 16 wherein the second of the physical values is the surface potential of the second body.

18. The method of measuring of claim 17 including:
- exciting the vibrating body as a whole into resonant vibration in its fundamental mode with piezo-electric actuator means, and
- exciting the partial body into resonant vibration in its fundamental mode by the application of an alternating voltage to that partial body and the object under examination.

19. The method of claim 17 including rigidly mounting said vibrating body at one end of the second of the two partial bodies for vibration of the vibrating body at the fundamental resonant frequency of the body as a whole and configuring the second of the two partial bodies to function as a substantially rigid mount for the first of the two partial bodies for vibration of the first partial body for substantially independent vibration at the resonant frequency of the first partial body.

20. A resonant sensor for the determination of at least two physical values, wherein the resonant sensor comprises:
- a vibrating body which is configured for excitation into vibration at the fundamental resonant frequency of the whole vibrating body to measure a first of the two physical values characterized in that vibrating body is made up of at least two individual partial bodies with different geometrical dimensions, which partial bodies are composed of different materials and one partial body is configurated for independent excitation into vibration at the fundamental resonant frequency of the one partial body to measure the second of the two physical values.

* * * * *